United States Patent
Qawami et al.

(10) Patent No.: US 7,944,764 B1
(45) Date of Patent: May 17, 2011

(54) WRITING TO NON-VOLATILE MEMORY DURING A VOLATILE MEMORY REFRESH CYCLE

(75) Inventors: Shekoufeh Qawami, El Dorado Hills, CA (US); Sean Eilert, Penryn, CA (US)

(73) Assignee: Micron Technology, Inc., Boise, ID (US)

( * ) Notice: Subject to any disclaimer, the term of this patent is extended or adjusted under 35 U.S.C. 154(b) by 312 days.

(21) Appl. No.: 12/347,900

(22) Filed: Dec. 31, 2008

(51) Int. Cl.
*G11C 7/00* (2006.01)
(52) U.S. Cl. .................................................. 365/200
(58) Field of Classification Search .................. 365/222
See application file for complete search history.

(56) References Cited

U.S. PATENT DOCUMENTS
2003/0191974 A1* 10/2003 Kato et al. .................... 713/300
* cited by examiner

*Primary Examiner* — Huan Hoang
*Assistant Examiner* — Anthan T Tran
(74) *Attorney, Agent, or Firm* — Blakely, Sokoloff, Taylor & Zafman LLP

(57) ABSTRACT

Writing to non-volatile memory during a volatile memory refresh cycle is described. In one example, a write command is received and data is received to write into a memory cell. The data is temporarily stored in response to the write command. A refresh command is received and the temporarily stored data is written into the memory cell in response to the refresh command.

20 Claims, 6 Drawing Sheets

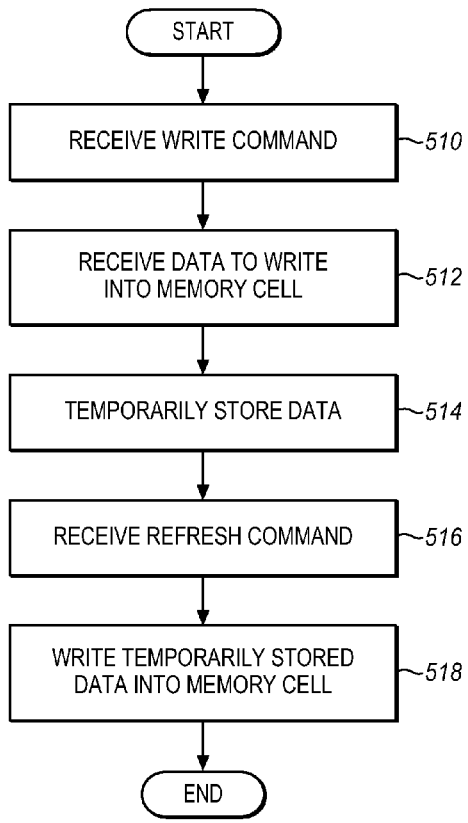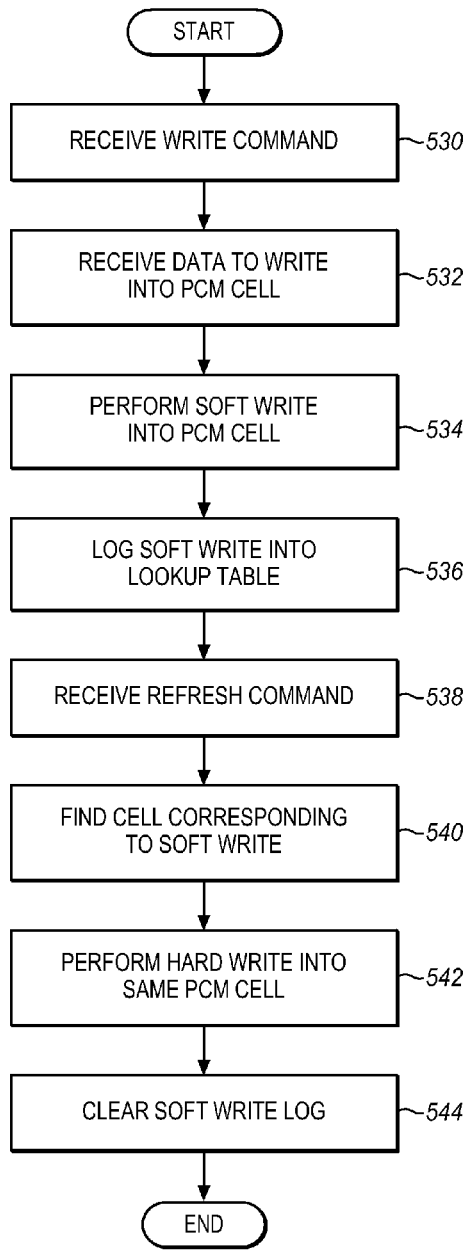

WRITING TO NON-VOLATILE MEMORY DURING A VOLATILE MEMORY REFRESH CYCLE

PCM (Phase Change Memory) has been proposed as a replacement for DRAM (Dynamic Random Access Memory). DRAM is used as a high speed data storage memory in computers and a wide range of other electronic devices. Its most prominent use may be as system memory in a personal computer, but is also sees use as mass data storage for server arrays and as short term memory in embedded systems. DRAM offers significant benefits, in speed, price, longevity, and reliability.

DRAM, however, is a volatile memory and is typically supported by a backup non-volatile memory such as a hard disk drive, flash memory, ROM (read only memory), etc. Because it is a volatile memory it is most commonly used to store temporary values that can be lost without significant impact. In a desktop computer, for example, a power failure will result in a complete loss of any values stored in DRAM.

PCM is a non-volatile memory that uses less power than DRAM and may be less expensive to manufacture. In addition, it does not require additional power to retain the values stored in memory. However, while PCM has fast read speeds, it's write speeds are currently significantly slower than DRAM. These differences may result in changes and improvements to how memory systems are managed and used. However, in order to use PCM as a direct replacement in a system designed for DRAM, the overall performance for read and write speeds of PCM must be comparable or better than is currently offered by DRAM.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 5A is a process flow diagram of writing to a non-volatile memory during a refresh cycle in accordance with an embodiment;

FIG. 5B is a process flow diagram of writing to a PCM memory array during a DRAM refresh cycle in accordance with an alternative embodiment.

Figure 1:
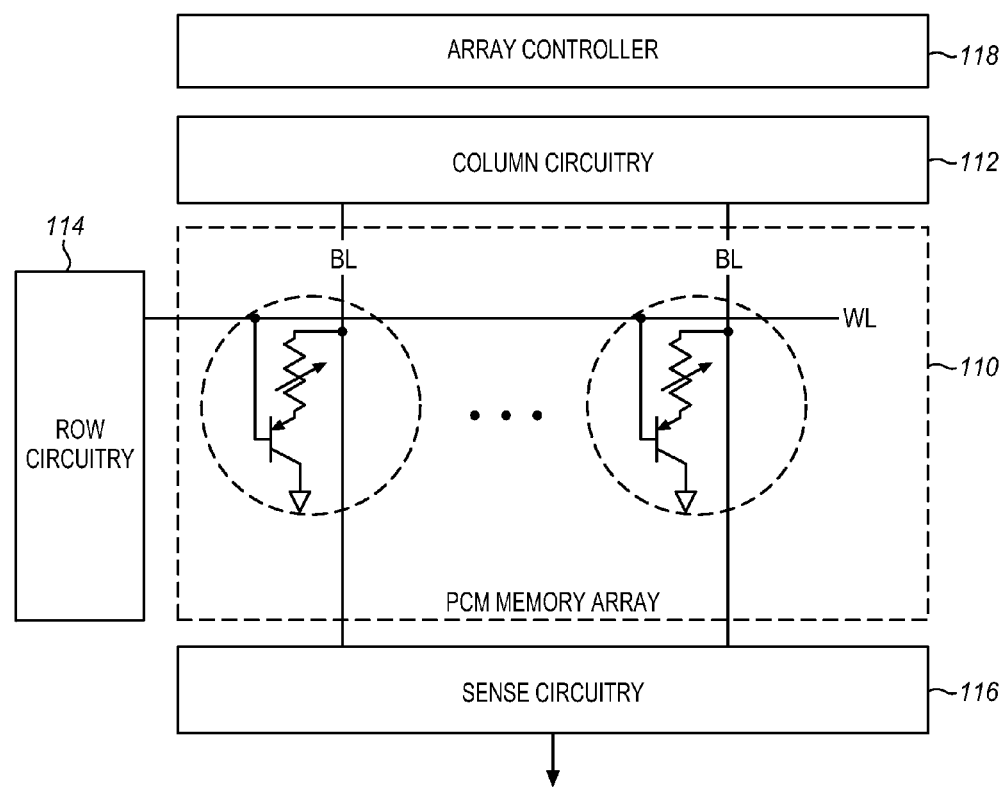
FIG. 1 shows a PCM memory array with memory cells that include a storage material in combination with a selector device in accordance with an embodiment.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

DRAM (Dynamic Random Access Memory) supports fast write speeds and is a volatile memory. Accordingly, it must be refreshed periodically. In typical applications every DRAM cell must be refreshed about once every 32-64 ms. If this is not done, then the data is eventually lost. The refresh cycle involves reading the data in the cell and the re-writing it back into the cell.

During the refresh cycle no data may be read from or written to the cell. The refresh cycle typically requires 10 ns to a few 100 ns. In an array, the entire array is refreshed at the same time or in some cases one part of the array is refreshed while another part is being read or written. The refresh cycle can move around the array until the entire array is refreshed and then the cycle repeats.

Systems that use DRAM are designed to accommodate the refresh cycle in their operations. The particular way in which this accommodation is done varies. In a sophisticated system, the processor reads and writes whenever it desires, the data is then buffered by a memory controller which manages the reads and writes around the refresh cycle times. In a simple system, all memory use is stalled during each refresh cycle.

PCM typically uses a multi-step algorithm to write data to a cell. This algorithm involves pulsing the cell, verifying the data and then repeating the pulsing and verifying a few times to ensure that the data value is written in the cell to within sufficient margin of error. This algorithm can take a few 100 ns. Once the data is written with a sufficient margin, there is no need to refresh the data again. The data is non-volatile compared to the volatile state of DRAM.

While the typical write cycle is much slower than that of DRAM, it takes about the same amount of time as a DRAM refresh cycle, about 100 ns. DRAM refresh cycles are typically 100 ns or higher. In a system designed for DRAM, memory operation will be shut down for each refresh cycle. Because PCM does not require refreshing, this time can be used for the PCM write algorithm. In this way, PCM can be intermixed with and can replace DRAM without any changes to the operation of the system.

In order to use the refresh cycle as a write cycle, all of the data received between each refresh cycle must be initially stored at a speed comparable to that of a DRAM write cycle. At the refresh cycle, this data can then be written into the PCM array. The temporary storage can then be flushed so that it is ready for the next set of data to be written. Typically, for desktop computer and video system, there will be about 1-4 kilobytes of data to buffer between refresh cycles. For an array of 1-16 gigabytes, this is a small buffer that can be provided at a very low cost.

One way to obtain a PCM write speed comparable to that of DRAM is to initially write data to a fast temporary buffer. The buffer can be constructed using any type of high write speed memory, including DRAM or SRAM. Due to its small size, the type of memory selected will not have a significant impact on the cost of an array.

As an alternative to a DRAM or SRAM (Static Random Access Memory) buffer, PCM can be used as the buffer. PCM can be operated differently to allow for fast write speeds. A direct fast pulse may be used to write data to a PCM cell. The pulse allows the cell to keep an imprint of the data and maintain a high write bandwidth with low latency.

Data written in this way, however, might not be maintained as non-volatile unless it is followed up with the standard multi-step algorithm. It may also have a much higher bit failure rate. This new direct fast pulse can be used as a "soft" write that can then be followed up with a "hard" write during the refresh cycle. The refresh cycle provides enough time to re-pulse the cell several times and verify the stability of the written data.

To set a PCM cell so that it reliably maintains the set value, the cell is kept near the crystallization temperature of the phase change material for a fixed amount of time, typically 10's of ns. This is done by passing a current through a resistance heating element in the cell. The heating element in turn raises the temperature of the phase change material for just that cell.

A fast pulse of, for example 20 ns or less, is sufficient to accurately write data to a cell. However, because of variations in the heating current, in the resistive heating element and in the thermal conductors applying the heat to the phase change material and pulling heat away from the cell, the heating process may be unreliable. To more reliably set the cell, in many PCM arrays the current is swept slowly through a wide range of currents. This ensures that the desired temperature is maintained for long enough to set the phase change material to its desired state. This slow sweeping pulse can take 200 ns or so and is often repeated twice for certainty, depending on the write algorithm for the particular array.

Using the slower longer sweeping pulse provides more margin. In other words, the set memory value is stable, does not drift because of very high or low temperatures, nor over long periods of time and reliably reads as the set value each time.

The fast pulse or soft write can still be used, when managed carefully. If the number of cells which have been written in the fast mode is small and if they are soon to be refreshed, then low-margin writes can be reliably used as part of the overall population of cells in a larger array.

The direct fast pulse differs from a typical write cycle in all of the ways mentioned above. In addition to using a single pulse and not checking the value after it is written, the pulse can use a much faster current ramp, that is the slope of the current ramp is faster and the start and end points of the ramp are truncated. This allows the write speed for PCM arrays to be treated as equivalent to popular types of volatile memory. The specific characteristics of both the fast and slow write cycle can be adapted to the particular characteristics of the memory array and its intended application.

A PCM-based temporary buffer may be constructed of a separate section of an array, or instead of a temporary buffer, the data may be written directly into its final location. The data values and their locations can be tracked using a look-up table. The look-up table can point to cells that require rewriting during the next refresh cycle.

As a further alternative, data may be written to its final location using the direct fast pulse. Then, instead of tracking all of the new writes, the entire array can be written according to the slow algorithm during one or more refresh cycles. This will involve more re-writes than strictly necessary, but it will eliminate the need to carefully track all of the data and its history.

FIG. 1 illustrates an array of PCM cells 110 in a system memory, a nonvolatile memory in a processor core, or any other application. The array is coupled to column circuitry 112 and row circuitry 114 that allows each of the cells in the array to be accessed for read and write operations. Sense circuitry 116 is coupled to the column and row circuitry to sense values when reading and writing to a cell. An array controller 118 is coupled to the other circuitry to manage memory operations of the array.

Each memory cell in the array includes alloys of elements of group VI of the periodic table, elements such as Te or Se that are referred to as chalcogenides or chalcogenic materials. Chalcogenides may be used advantageously in phase change memory cells to provide data retention and remain stable even after the power is removed from the nonvolatile memory. Taking the phase change material as $Ge_2Sb_2Te_5$ for example, two phases or more are exhibited having distinct electrical characteristics useful for memory storage.

Array 110 includes memory cells each having a selector device and a memory element. Although the array is illustrated with bipolar selector devices, it should be noted that alternative embodiments may use CMOS selector devices or diodes to identify and selectively change the electrical properties (e.g. resistance, capacitance, etc.) of the chalcogenide material through the application of energy such as, for example, heat, light, voltage potential, or electrical current. The chalcogenic material may be electrically switched between different states intermediate between the amorphous and the crystalline states, thereby giving rise to a multilevel storing capability.

To alter the state or phase of the memory material, this embodiment illustrates a programming voltage potential that is greater than the threshold voltage of the memory select device that may be applied to the memory cell. An electrical current flows through the memory material and generates heat that changes the electrical characteristic and alters the memory state or phase of the memory material. By way of example, heating the phase-change material to a temperature above 900° C. in a write operation places the phase change material above its melting temperature ($T_M$). Then, a rapid cooling places the phase-change material in the amorphous state that is referred to as a reset state where stored data may have a "1" value. Taking $Ge_2Sb_2Te_5$ as an example, the time between achieving the melting temperature $T_m$ and quenching after the local heating to achieve the amorphous phase may be less than 50 ns.

On the other hand, to program a memory cell from reset to set, the local temperature is raised higher than the crystallization temperature ($T_x$) for a time longer than 50 ns (for $Ge_2Sb_2Te_5$) to allow crystallization to complete. The phase-change material in the crystalline form is referred to as a set state and stored data may have a "0" value. Thus, the cell can be programmed by setting the amplitude and pulse width of the current that will be allowed through the cell. In summary, a higher magnitude, fast pulse will amorphize the cell, whereas a moderate magnitude, longer pulse will allow the cell to crystallize.

In a read operation, the bit line (BL) and word line (WL) are selected and an external current is provided to the selected memory cell. To read a chalcogenide memory device, the current difference resulting from the different device resistance is sensed. It is then determined whether data stored in the selected memory cell is a "1" or "0" based on a voltage change caused by a resistance of the phase-change material of the selected memory cell. It is to be appreciated that the association of reset and set with amorphous and crystalline states, respectively, is a convention and that at least an opposite convention may be adopted.

Figure 2:
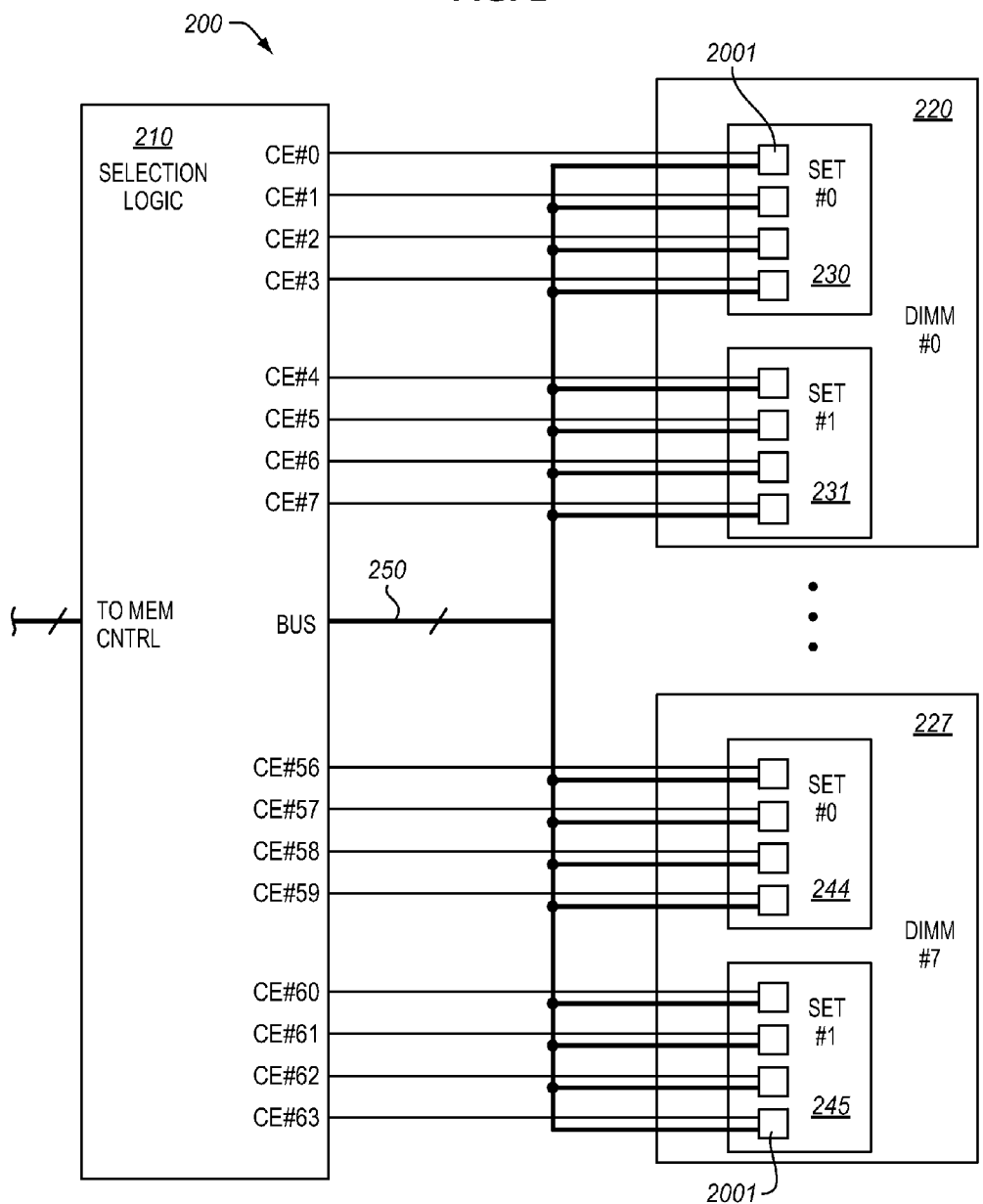
FIG. 2 is a schematic representation of a portion of a memory module that includes a PCM memory array in accordance with an embodiment.

FIG. 2 shows a diagram of a memory sub-system that can incorporate the arrays of FIG. 1. For simplicity as in FIG. 1 only a few of the memory devices are shown. There may be many more than those illustrated. In FIG. 2, a first (DIMM #0) and last (DIMM #7) of eight DIMMs (Dual Inline Memory Module), with each DIMM (220, 227) containing two sets (230, 231 in DIMM #0 and 244, 245 in DIMM #7) of four memory devices each. Each device may correspond to an array 110 as shown in FIG. 1. The memory devices are all labeled 2001, indicating for this example that they may all be identical devices except for their location and connections in the system.

Figure 3:
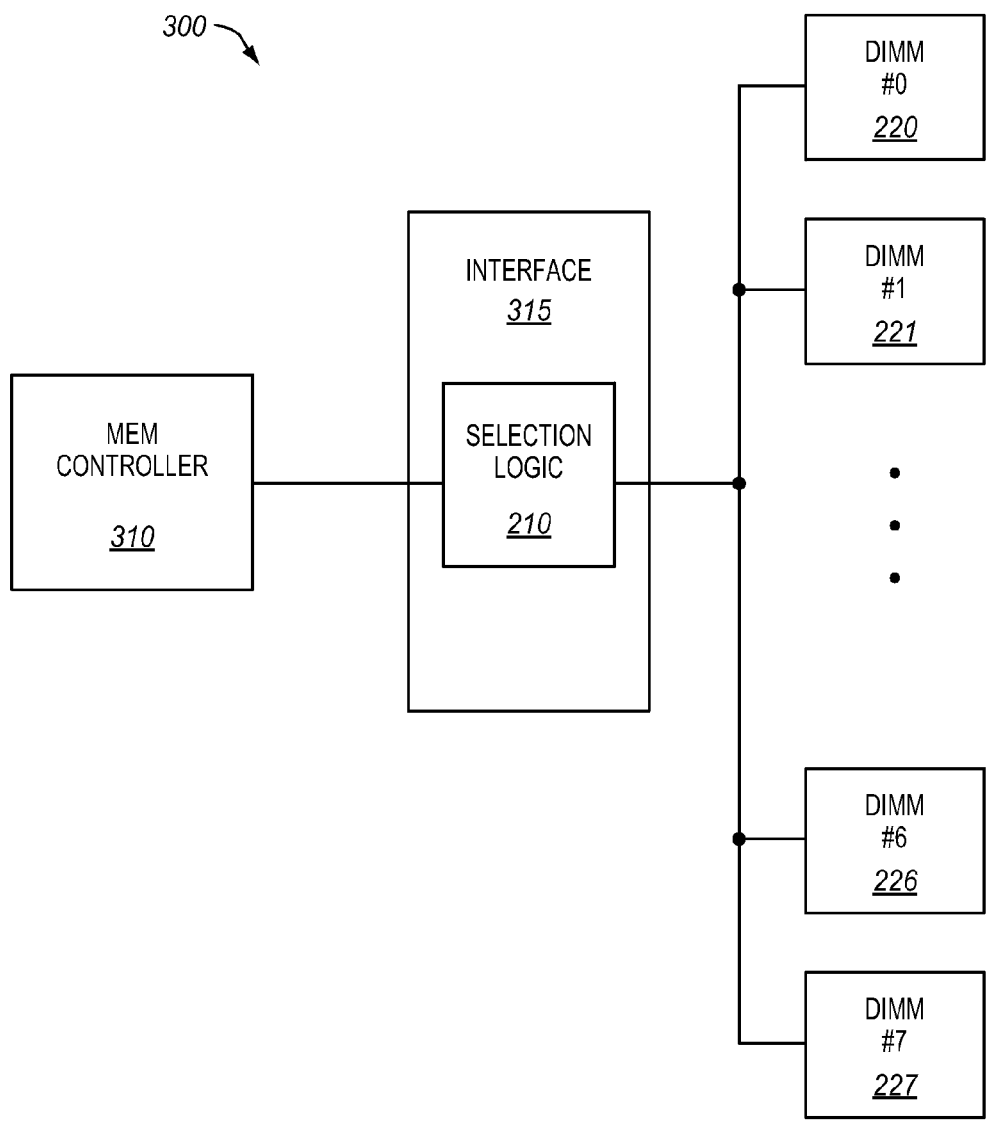
FIG. 3 is a schematic representation of a memory module that includes a PCM memory array in accordance with an embodiment.

In memory system 200, selection logic 210 is coupled to a memory controller (see e.g. FIG. 3, 310). The selection logic may receive a command from the memory controller, such as a command to read, write or refresh. The memory controller will select the memory devices indicated in the command for performing a subsequent operation. Selection of each memory device may be accomplished in various ways. In the illustrated example, a separate Chip Enable (CE) line is connected from the memory controller to each memory device. In the example 64 CE lines are shown, one for each memory device. Multiple CE lines may be activated if the selection command indicates that multiple memory devices are to be selected.

A signal asserted on a CE line may cause the selected memory device to activate its interface so that it will perform any operations indicated on a common bus lines 250. The common bus line is also coupled between the memory controller and the memory devices. This bus is a multiple line bus that carries data, commands, timing and other information, depending on the particular application. If multiple memory devices are selected, they may all receive the same operation command, and possibly the same data over the common bus, at the same time, and perform the same operations in response to that operation command and data. Although the illustrated example shows a CE line to each memory device that can select the device for operation, other techniques may also be used.

FIG. 3 shows a diagram of memory system 300, according to an embodiment of the invention. DIMMs 220-227 may be similar to those previously described. Selection logic 210 is coupled to each of the DIMMs using, for example, the approach shown in FIG. 2. The selection logic may be part of a larger interface 315, coupled to the memory controller 310, through which the memory controller may control and communicate with the memory devices on the DIMMs. The memory bus between the memory controller 310 and interface 315 may take various forms.

The memory bus may have input-output (I/O) lines used to sequentially convey a selection command, an operation command, and other data necessary for the completion of the command sequence. A timing signal CLK may be used to provide timing synchronization for the signals that are on the I/O lines.

A selection signal SELECT may be used to indicate that this is a selection command. An operation command may be used to indicate the meaning of the subsequent data signals on the I/O lines. The meaning of the data signals may vary depending on what operation was specified by the operation command. Other lines carrying other signals (not shown) may also be contained in the memory bus as needed. Embodiments of the present invention may be applied to single data rate (SDR) techniques, in which only one edge of the clock signal is used to latch the data, as well as other techniques. For example, a double date rate (DDR) technique may be used, in which both the rising and falling edges of the clock signal are used to latch data.

Figure 4:
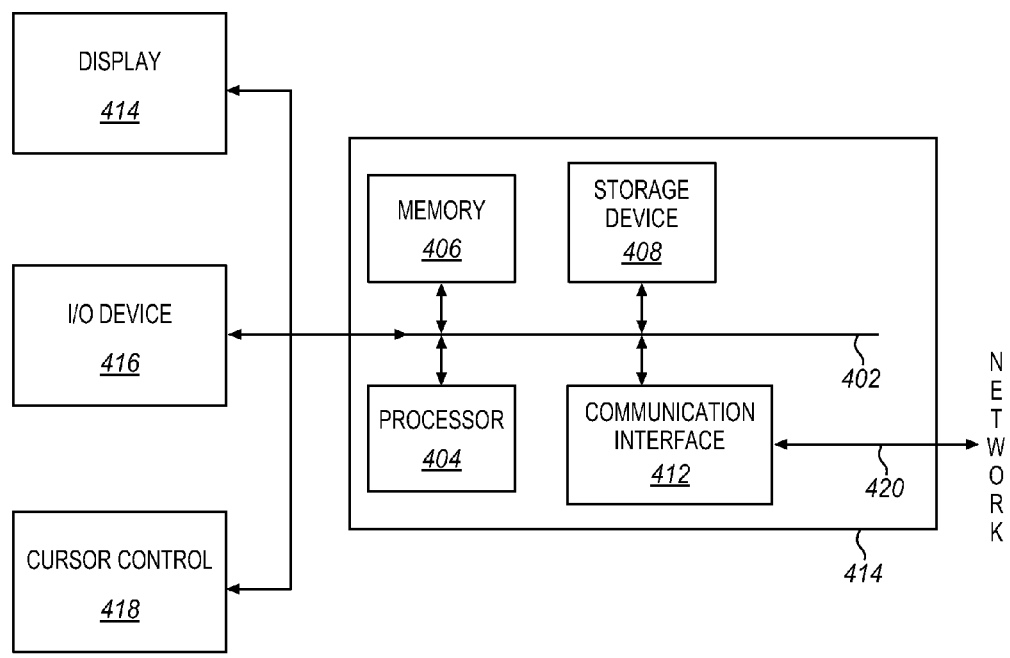
FIG. 4 is a schematic representation of a computer system incorporating memory modules in accordance with an embodiment.

FIG. 4 is a simplified block diagram of a general overview of a host computing device suitable for hosting a system memory, processor memory and long term mass storage in accordance with an embodiment of the invention. In some embodiments, host computing device 114 may be used to implement computer programs (e.g., content protection platform), logic, applications, methods, processes, or other software to access content. Examples of host computing device 114 include a desktop computer, a server, a portable computing device, a personal digital assistant, a mobile phone, a computational engine within an appliance, and other computer systems. As shown in FIG. 4, host computing device 414 includes bus 402 or other communication mechanism for communicating information, which interconnects subsystems and devices, such as processor 404, system memory 406, mass storage device 408, communication interface 412 (e.g., modem or Ethernet card), display 414 (e.g. liquid crystal display (LCD)), input/output device 416 (e.g., keyboard), and cursor control 418 (e.g., mouse or trackball).

In some embodiments, host computing device 414 performs specific operations by processor 404 when executing one or more sequences of one or more program instructions stored in system memory 406. Such program instructions may be read into system memory 406 from another computer readable medium, such as mass storage device 408. In some embodiments, hard-wired circuitry may be used in place of or in combination with software program instructions to implement embodiments of the invention.

In some embodiments, the processor is coupled to the bus through a chipset. A memory controller hub may be coupled between the processor and the system memory 406, or the processor may be coupled directly to the system memory. Similarly an input/output controller hub may be coupled between processor or the memory controller hub and the mass storage device. Such a hub may also be used to connect to communications and other input and output devices. The specific configuration may be adapted to suit different application and embodiments of the invention may be adapted to suit.

In some applications, the processor is further connected to a graphics system (not shown) which drives the display 414. The graphics system typically includes a graphics processor coupled to the main processor and may have its own memory or use the system memory depending on the configuration. There may be multiple graphics processors and multiple graphics systems, depending on the configuration. The graphics system typically uses a high speed DRAM, such as DDR3 (Double Data Rate 3) type DRAM. However, the present invention may also be used to adapt a non-volatile memory array to this application.

While the system memory 406 is typically implemented in DRAM, a PCM system as described herein may also be used. Similarly, while the mass storage is typically implemented in magnetic hard disk or flash memory, a PCM system as described herein may also be used. Also, while the processor typically has on-board cache memory implemented as SRAM, a PCM system may also be used.

FIG. 5A shows a process that allows PCM memory to replace DRAM and other volatile memory types using approaches as described above. The process starts and at block 510, a write command is received. This write command is typically received at a memory controller such as memory controller 310 shown in FIG. 3. The particular component at which such a command is received will depend upon the particular implementation.

At block 512, data to write into a memory cell is also received. While the process is described as writing data into a cell. In a typical scenario, the data will be received in a 16, 32, or 64-bit wide block. For a typical configuration 64 or more cells will be needed in order to write the entire block of data. Accordingly, the operation of writing the data into a cell is repeated 64 times in 64 different cells. The storage capacity of one cell is typically a single bit, however, some memory types, including PCM, are capable of three or more states. In such a case, there may be two or more data per cell. With a two-state cell, the data, as described in this description, is more accurately a single datum. In this description, however, data is used as both the singular datum and the plural data.

This data may, for example, be received on a bus together with the write command. At block 514, the data is temporarily stored in response to the write command. The temporary storage may be a separate buffer or it may be in the memory cell array to which the data will eventually be written. Within that memory cell array it may be to the same or a different cell than the cell into which the data will eventually be written. As compared to use with a volatile memory, however, this temporary writing is used only temporarily to satisfy the speed demands of the interface and not to obtain the ultimate storage of the data.

As described above, the temporary storing may be done with a soft write to a memory cell. In the case of a PCM cell, this soft write can be in the form of a single fast pulse. If the temporary storing is to another type of memory, then the type of writing may be adapted to suit the particular circumstances.

At block 516, a refresh command is received. As mentioned above, the refresh command is intended for use in maintaining values that have already been written into a volatile memory. The refresh command does not include any new data to be written or data locations to be read. At block 518, instead of performing a refresh, the temporarily stored data is written into a memory cell. In the examples above, this is a non-volatile memory cell such as PCM and the refresh cycle is used to allow enough time for a hard write. However, such an approach may be used for any type of memory that has slow write times. The temporary storage allows for a fast write cycle to be emulated or performed for short times and then the refresh cycle may be used to accommodate the slower write requirements of the memory.

The operations described above, may be performed by a memory controller, by an array controller, or by a central processing unit, depending on the particular application.

FIG. 5B shows an alternative process for use specifically with PCM arrays. This process does not require a buffer to operate and takes advantage of a high speed soft write and a slower speed hard write. As in FIG. 5A as the process starts, a write command is received at block 530. At block 532, the data is received that corresponds to the write command. At block 534, a soft write is performed to write the received data into a PCM cell. This soft write is a write into non-volatile memory in a way that does not ensure the accuracy and stability desired of a non-volatile memory, but provides the speed expected from the write command.

At block 536, the soft write is logged. In the figure, the log is a lookup table, but a variety of other approaches can be used. The log is used to keep track of the soft writes. A memory controller typically maintains a table that relates logical memory addresses to physical memory locations in, for example, each of the memory devices of a DIMM. When it comes time to read data, the read command will include the logical memory address and the memory controller will map that to the physical address to read the appropriate cell. This map of memory addresses may be consolidated with or kept apart from the log of soft writes.

At block 538, a refresh command is received. As mentioned above, during the refresh cycle, there are no reads or writes. However, since the non-volatile memory does not require refreshes, this time can be used to accommodate the slower write speed of the memory cell array. Accordingly, at block 540, the log is consulted to find the memory cells that have soft writes and at block 542, a hard write is performed on these cells. The hard write renders the stored data non-volatile, as compared to the soft write which may not have. The data now provides the accuracy, stability, and longevity that the standard slow write process for the cell offers. At block 544, the soft write log is cleared.

In one embodiment, all of the writes that are performed between refresh cycles are logged. After the refresh cycle, the log is then cleared. In this way, the log only needs to be sufficient to track the writes that occur between refresh cycles. In another embodiment, the log is a part of the memory map and for each physical memory location, there is an indication as to whether the data has been written securely. This allows for second and additional refresh cycle to be used, if the data has not been properly written after the first refresh cycle. In yet another embodiment, there is no log and all of the memory cells are rewritten at each refresh cycle.

The PCM memory array of FIGS. 2 and 3 is adapted to resemble a typical DRAM module. Such a module is built on a printed circuit board with DIMM chips, a controller chip and a row of connectors on one edge of the card to mount into a socket. In such a configuration the log can be maintained by the memory controller on the module and can be contained within the memory controller chip. Alternatively, a separate chip can be maintained for this purpose. Similarly, if a temporary write buffer is provided as mentioned above in the context of FIG. 5A, then this buffer can be within the memory controller chip or provided as a separate chip on the module.

While the description above, has been primarily directed to writing to a PCM cell during a refresh cycle that is intended for a DRAM cell, the invention is not so limited. Many types of volatile memory require a refresh cycle and many types of non-volatile memory have slower write times. The approaches described above can be used to provide fast volatile memory write performance by exploiting the refresh cycle as a write cycle to a slower non-volatile array.

Figure 6:
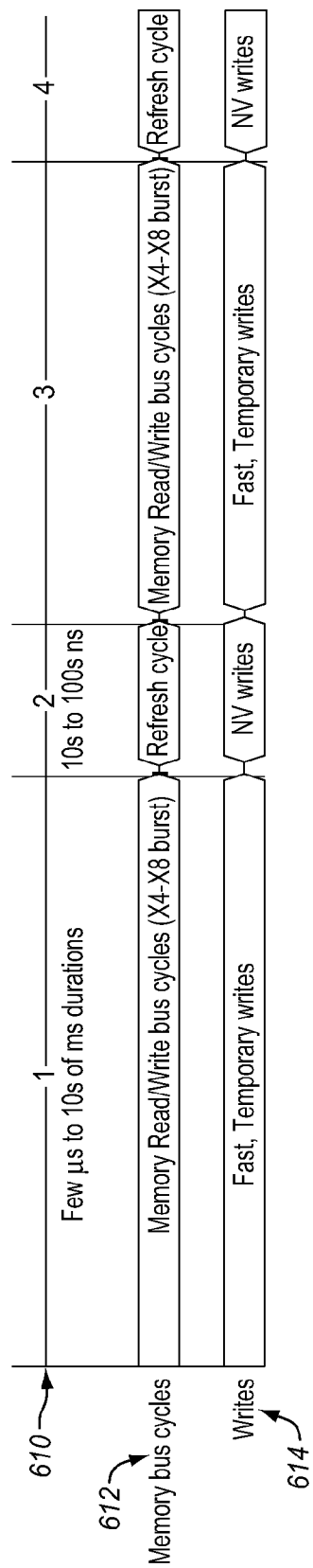
FIG. 6 is a timing diagram of writing to a memory array during a refresh cycle according to an embodiment.

FIG. 6 represents a timing diagram for a typical DRAM memory controller. There are four timing periods labeled sequentially as 1, 2, 3, and 4. For each period, the top line 610 indicates a typical duration. The middle line indicates the bus cycles on the memory bus for a typical DRAM application and the bottom line indicates the type of write activity that may be performed according to embodiments of the present invention. The sequential labels are intended as examples of a continuing process that may start with any one of the periods or with some other cycle.

In the first period, there are memory read and write cycles. These are indicated as X4 and X8 bursts, but there are variety of different types of DRAM burst depending on the particular application. As indicated, this period may last a few microseconds to tens of milliseconds. During this period fast, temporary writes, such as the soft writes or buffer writes discussed above may be performed.

In the second time period a refresh is performed on the DRAM array. The refresh cycle can last from tens to hundreds of nanoseconds. During this time period, non-volatile or hard writes can be performed.

The third period is the same as the first period and the fourth period is the same as the second period. These periods are provided to indicate how the cycles repeat over time. FIG. 6 also indicates how the processes of FIGS. 5A and 5B can coexist with typical DRAM processes. As a result, PCM modules, for example, may be mixed with DRAM modules in single system. In addition, PCM modules may be used instead of DRAM in a system that is configured specifically for DRAM. Similar principles may be applied to other types of volatile memory with refresh cycles and slower writing memory without refresh cycles.

The term "computer readable medium" refers to suitable medium that participates in providing program instructions to a processor, a memory controller or other suitable device for execution. Such a medium may take many forms, including but not limited to, non-volatile media, and volatile media. Non-volatile media may include, for example, optical or magnetic disks, solid state storage and other memory, ROM, etc. Volatile media may include dynamic memory, such as system memory, DRAM, SRAM, and other types of volatile storage. Common forms of computer readable media include, for example, magnetic mediums (e.g., floppy disk, flexible disk, hard disk, magnetic tape, and other magnetic mediums), optical mediums (e.g., compact disc read-only memory (CD-ROM) and other optical mediums), physical medium with patterns (e.g., punch cards, paper tape, any other physical mediums), memory chips or cartridges, (e.g., RAM, programmable read-only memory (PROM), erasable programmable read-only memory (EPROM), flash memory, and other memory chips or cartridges), and any other medium from which a computer can read.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

Specific embodiments of the present invention have been described above, however, the invention is not limited to the details of such embodiments, but only by the claims below and their reasonable equivalents.

The invention claimed is:

1. A method comprising:
   receiving a write command;
   receiving data to write into a memory cell;
   temporarily storing the data in response to the write command;
   receiving a refresh command; and
   writing the temporarily stored data into the memory cell in response to the refresh command.

2. The method of claim 1, wherein receiving a write command comprises receiving a write command at a memory controller and wherein the memory cell is a cell of a memory cell array coupled to the memory controller.

3. The method of claim 1, wherein temporarily storing comprises writing the received data into a buffer.

4. The method of claim 1, wherein temporarily storing comprises writing the received data into a memory cell of a memory cell array that is reserved for temporary storage.

5. The method of claim 1, wherein temporarily storing comprises writing the received data into the memory cell using a fast method.

6. The method of claim 5, wherein using the fast method comprises writing the received data into the memory cell using a method that results in volatile data storage.

7. The method of claim 6, wherein the fast method comprises a direct fast pulse of current into a phase change memory cell.

8. The method of claim 5, wherein writing in response to the refresh command comprises re-writing the received data into the memory cell using a slow method.

9. The method of claim 6, wherein writing in response to the refresh command comprises writing using a method that results in non-volatile storage.

10. The method of claim 1, wherein writing comprises permanently writing.

11. The method of claim 10, wherein permanently writing comprises writing into a non-volatile memory cell array.

12. The method of claim 1, wherein the memory cell is a phase change memory cell.

13. The method of claim 1, wherein the memory cell has a material having at least two stable states that differ in electrical resistance.

14. The method of claim 13, wherein the memory cell material is a chalcogenide.

15. A memory device comprising:
a memory cell array comprising a plurality of memory cells; and
a memory controller coupled to the memory cell array to receive a write command, to receive data to write into a memory cell, to temporarily store the data in response to the write command, to receive a refresh command, and to write the temporarily stored data into the memory cell in response to the refresh command.

16. The memory device of claim 15, further comprising a buffer coupled to the memory array, the memory controller temporarily storing the date in the buffer.

17. The memory device of claim 16, wherein the buffer is a dynamic access random access memory.

18. A memory system for use as a system memory comprising:
a printed circuit board having a row of connectors on an edge to engage a system memory socket;
a plurality of memory modules mounted to the printed circuit board each including at least one memory cell array, each memory cell array comprising a plurality of memory cells; and
a memory controller mounted to the printed circuit board and coupled to the memory cell array to receive a write command, to receive data to write into a memory cell, to temporarily store the data in response to the write command, to receive a refresh command, and to write the temporarily stored data into the memory cell in response to the refresh command.

19. The memory system of claim 18, wherein the memory controller temporarily stores the data by applying a fast single pulse to a phase change memory cell of a memory cell array and writes the temporarily stored data by applying a ramped current sweep to the cell of the memory cell array.

20. The memory system of claim 18, further comprising a volatile memory buffer, wherein the memory modules comprise non-volatile memory cells, wherein the write speed of the buffer is faster than the write speed of the memory modules, and wherein the memory controller temporarily stores the data in the buffer.

* * * * *

UNITED STATES PATENT AND TRADEMARK OFFICE
CERTIFICATE OF CORRECTION

PATENT NO. : 7,944,764 B1
APPLICATION NO. : 12/347900
DATED : May 17, 2011
INVENTOR(S) : Shekoufeh Qawami et al.

Page 1 of 1

It is certified that error appears in the above-identified patent and that said Letters Patent is hereby corrected as shown below:

In column 11, line 28, in Claim 17, after "dynamic" delete "access".

Signed and Sealed this
Fifth Day of July, 2011

David J. Kappos
*Director of the United States Patent and Trademark Office*